United States Patent
Kim et al.

(10) Patent No.: US 9,062,375 B2
(45) Date of Patent: Jun. 23, 2015

(54) LATERAL FLOW ATOMIC LAYER DEPOSITION APPARATUS AND ATOMIC LAYER DEPOSITION METHOD USING THE SAME

(75) Inventors: Woo Chan Kim, Daejeon (KR); Jeong Ho Lee, Seoul (KR); Sang Jin Jeong, Cheonan-si (KR); Hyun Soo Jang, Daejeon (KR)

(73) Assignee: ASM GENITECH KOREA LTD., Cheonan-Si (KR)

( * ) Notice: Subject to any disclaimer, the term of this patent is extended or adjusted under 35 U.S.C. 154(b) by 152 days.

(21) Appl. No.: 13/587,061

(22) Filed: Aug. 16, 2012

(65) Prior Publication Data

US 2013/0045331 A1    Feb. 21, 2013

(30) Foreign Application Priority Data

Aug. 17, 2011   (KR) .................. 10-2011-0081692
Aug. 14, 2012   (KR) .................. 10-2012-0089014

(51) Int. Cl.
*C23C 16/00*    (2006.01)
*C23C 16/455*   (2006.01)

(52) U.S. Cl.
CPC ....... *C23C 16/4558* (2013.01); *C23C 16/45504* (2013.01); *C23C 16/45548* (2013.01); *C23C 16/45591* (2013.01)

(58) Field of Classification Search
CPC .......... C23C 16/45587; C23C 16/45589; C23C 16/45591; C23C 16/45504
USPC .................................................... 156/345.33
See application file for complete search history.

(56) References Cited

U.S. PATENT DOCUMENTS

| | | | |
|---|---|---|---|
| 5,711,811 A | 1/1998 | Suntola | |
| 6,539,891 B1 | 4/2003 | Lee | |
| 6,562,140 B1 | 5/2003 | Bondestam | |
| 6,806,211 B2 | 10/2004 | Shinriki | |
| 6,926,920 B2 * | 8/2005 | Jang et al. | 427/8 |
| 6,994,887 B2 * | 2/2006 | Tanaka | 427/248.1 |
| 7,020,981 B2 | 4/2006 | Shero | |
| 7,754,013 B2 * | 7/2010 | Granneman | 117/105 |
| 2003/0000473 A1 * | 1/2003 | Chae et al. | 118/715 |
| 2006/0249077 A1 | 11/2006 | Kim | |
| 2008/0102203 A1 * | 5/2008 | Wu et al. | 427/248.1 |
| 2009/0156015 A1 * | 6/2009 | Park et al. | 438/758 |
| 2009/0217873 A1 | 9/2009 | Iino | |

FOREIGN PATENT DOCUMENTS

KR   10-0624030 B1   9/2006
KR   10-2008-0005970 A   1/2008

* cited by examiner

*Primary Examiner* — Gordon R Baldwin
*Assistant Examiner* — Charlee Bennett
(74) *Attorney, Agent, or Firm* — Lexyoume IP Meister, PLLC

(57) ABSTRACT

A lateral flow atomic layer deposition (ALD) apparatus has two gas inflow channels and two gas outflow channels that are connected to two gas outlets that are symmetrically formed based on a substrate in which a thin film is deposited, thereby differently guiding a flow direction of a gas flowing on the substrate. Therefore, uniformity of a deposited film is improved, compared with the conventional lateral flow ALD apparatus in which a supplied source gas and reaction gas constantly flow in only one direction on the substrate.

15 Claims, 7 Drawing Sheets

LATERAL FLOW ATOMIC LAYER DEPOSITION APPARATUS AND ATOMIC LAYER DEPOSITION METHOD USING THE SAME

CROSS-REFERENCE TO RELATED APPLICATION

This application claims priority to and the benefit of Korean Patent Application No. 10-2011-0081692 filed in the Korean Intellectual Property Office on Aug. 17, 2011 and Korean Patent Application No. 10-2012-0089014 filed in the Korean Intellectual Property Office on Aug. 14, 2012, the entire contents of which are incorporated herein by reference.

BACKGROUND OF THE INVENTION (a) Field of the Invention

The present invention relates to a lateral flow atomic layer deposition apparatus and a method of depositing a thin film using the same.

(b) Description of the Related Art

In fabricating a semiconductor device, an effort to improve an apparatus or a process for forming a thin film with high quality on a substrate has been made. Nowadays, an atomic layer deposition (ALD) method to grow a thin film on a substrate is suggested where a thin film is formed on a substrate through a surface reaction by supplying two or more reactants separately and sequentially to the substrate, and a thin film with a desired thickness is obtained by repeating the sequential process mentioned above. Because a film is formed by a surface reaction, when using such a process, a thin film is deposited uniformly across the entire surface of the substrate regardless of protrusions and depressions of the substrate, and impurities in the film can be minimized such that a high quality thin film can be formed.

There are many types of ALD apparatus. In particular, a lateral flow atomic layer deposition reactor in which a gas flows in a direction parallel to a substrate provides fast gas switching since the gas flow is simple in the lateral flow atomic layer deposition reactor. Korean patent No. 624,030 and its corresponding U.S. Pat. No. 6,539,891 show a lateral flow ALD reactor. Since the volume of the reactor described in the above-identified patents is small enough to switch gases fast, the gas switching time for atomic layer deposition can be minimized, thus achieving high productivity. Further, their advanced structure is disclosed in Korean Patent Application No. 2007-7027238 and U.S. patent application Ser. No. 11/429,533. In this reactor, a plasma ALD method can be performed by supplying radio frequency (RF) power to the reaction space sequentially in accordance with a gas supply cycle.

Another example of a lateral flow atomic layer deposition reactor is disclosed in U.S. Pat. No. 5,711,811 and U.S. Pat. No. 6,562,140 in which a gap between a substrate surface and a surface opposite to the substrate is maintained constantly to make gas flow uniform such that the gas flow is maintained similarly to laminar flow on the substrate.

However, a lateral flow reactor has a problem because the difference in film uniformity on a substrate near a gas inlet and a gas outlet is large. Such a problem may be improved by rotating the substrate, however, it is not an easy task due to the complexity of a structure for rotating the substrate thereof, and difficulty in setting a process condition for rotating the substrate. Further, there have been efforts to solve such non-uniformity issue by changing a direction of a gas flow on the substrate (for example, see U.S. Pat. No. 6,806,211; U.S. Pat. No. 7,020,981; and U.S. Patent No. 2009/0217873). However, these patents failed to suggest a compact structure that is optimized for an ALD process.

The above information disclosed in this Background section is only for enhancing the understanding of the background of the invention, and therefore it may contain information that does not form the prior art that is already known in this country to a person of ordinary skill in the art.

SUMMARY OF THE INVENTION

The present disclosure provides a method and apparatus to improve film uniformity on a substrate.

An exemplary embodiment provides a lateral flow ALD apparatus in which a process gas flows between a surface in which a substrate is placed and a surface opposite thereto in a direction parallel to the substrate. In one embodiment, the lateral flow ALD apparatus includes a substrate support that supports the substrate; a reactor cover contacting the substrate support to define a reaction space; a first gas flow control plate that is located between the reactor cover and the substrate support; and a first gas outlet and a second gas outlet that are connected to a first gas outflow channel and a second gas outflow channel, respectively, between an upper surface of the first gas flow control plate and a lower surface of the inside of the reactor cover.

In one aspect, the first gas outlet and the second gas outlet may be located at an opposite side based on the surface of the substrate. The lateral flow ALD apparatus may further include a first gas inlet and a second gas inlet that supply a process gas to the reaction space. Furthermore, the lateral flow ALD apparatus may include a second gas flow control plate that is located at a lower part of the first gas flow control plate, wherein a process gas that is supplied through the first gas inlet and the second gas inlet may be supplied to the substrate through the first gas inflow channel and the second gas inflow channel between the first gas flow control plate and the second gas flow control plate.

In another aspect, the first gas inflow channel and the second gas inflow channel may be located at an opposite side based on the surface of the substrate. The first gas outflow channel and the second gas outflow channel may be defined with a space between a first outflow groove and a second outflow groove that are formed in an upper surface of the first gas flow control plate and a lower surface of the inside of the reactor cover. Further, the first gas inflow channel and the second gas inflow channel may be defined with a space between a first inflow groove and a second inflow groove that are formed in a lower surface of the first gas flow control plate and an upper surface of the second gas flow control plate.

In one embodiment, a process gas that is supplied through the first gas inlet may flow as laminar flow in a first direction on the substrate via the first gas inflow channel. A process gas flowing in the first direction on the substrate may be exhausted to the outside of the reactor through the second gas outflow channel. A process gas that is supplied through the second gas inlet may flow as laminar flow in a second direction on the substrate via the second gas inflow channel. A process gas flowing in the second direction on the substrate may be exhausted to the outside of the reactor through the first gas outflow channel. The second direction may be opposite to the first direction.

In one embodiment, the first gas outlet and the second gas outlet may include a first valve that is connected to an exhaust pump and a second valve that is connected to an inert gas supply line. When a process gas is exhausted through the first gas outlet, the inert gas may be supplied in the second gas outlet. In this case, an inert gas may be supplied to the first gas inlet. When a process gas is exhausted through the second gas outlet, the inert gas may be supplied to the first gas outlet. In this case, the inert gas may be supplied to the second gas inflow groove.

An atomic layer deposition method according to an exemplary embodiment includes a first gas supply cycle which include a first source gas supply step for supplying a source gas on a surface of a substrate in a first direction substantially parallel to the surface of the substrate and a first reactant supply step for supplying a reactant gas on the surface of the substrate in a second direction that is substantially parallel to the surface of the substrate and different from the first direction, and a second gas supply cycle which includes a second source gas supply step for supplying the source gas on the surface of the substrate in the second direction and a second reactant supply step for supplying the reactant gas on the surface of the substrate in the first direction.

In one aspect, during the first gas supply cycle, the first source gas supply step and the first reactant supply step may be repeated and during the second gas supply cycle, the second source gas supply step and the second reactant supply step may be repeated. During the first gas supply cycle, the first source gas supply step and the first reactant supply step may be alternately repeated and during the second gas supply cycle, the second source gas supply step and the second reactant supply step may be alternately repeated.

Further, the first gas supply cycle and the second gas supply cycle may be repeated. The second gas supply cycle may be repeated after the first gas supply cycle is repeated. The first gas supply cycle and the second gas supply cycle may be alternately repeated.

A lateral flow ALD apparatus according to an exemplary embodiment includes a double exhaust line, thereby changing a gas flow direction on a substrate and uniformly maintaining a thickness of a thin film between a gas inlet and a gas outlet.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
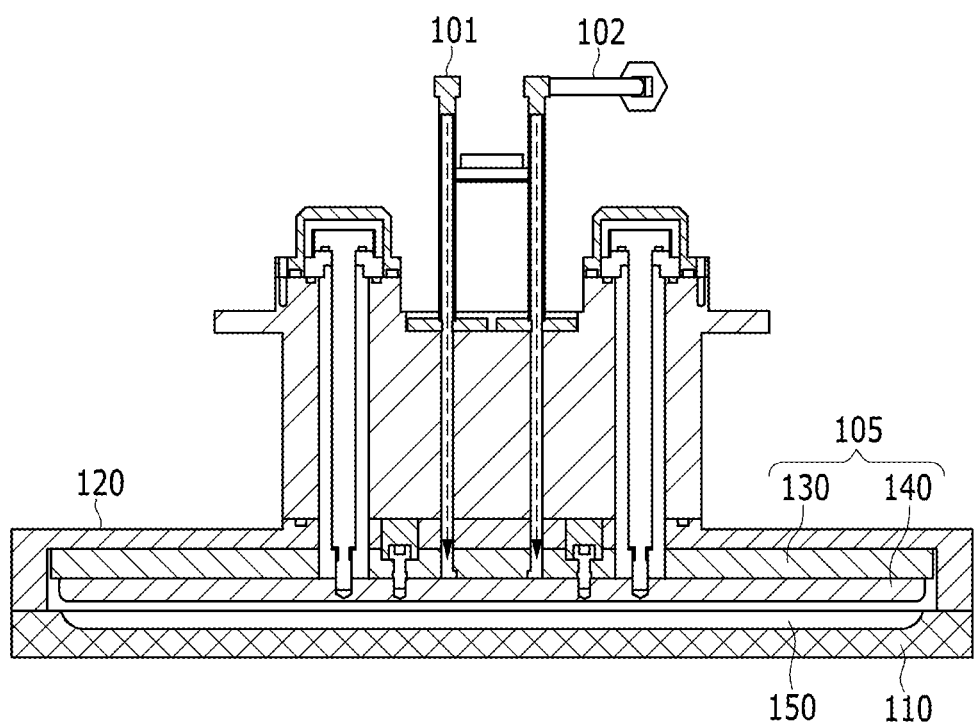
FIG. 1 is a cross-sectional view illustrating a lateral flow ALD apparatus according to an exemplary embodiment.
Figure 2:
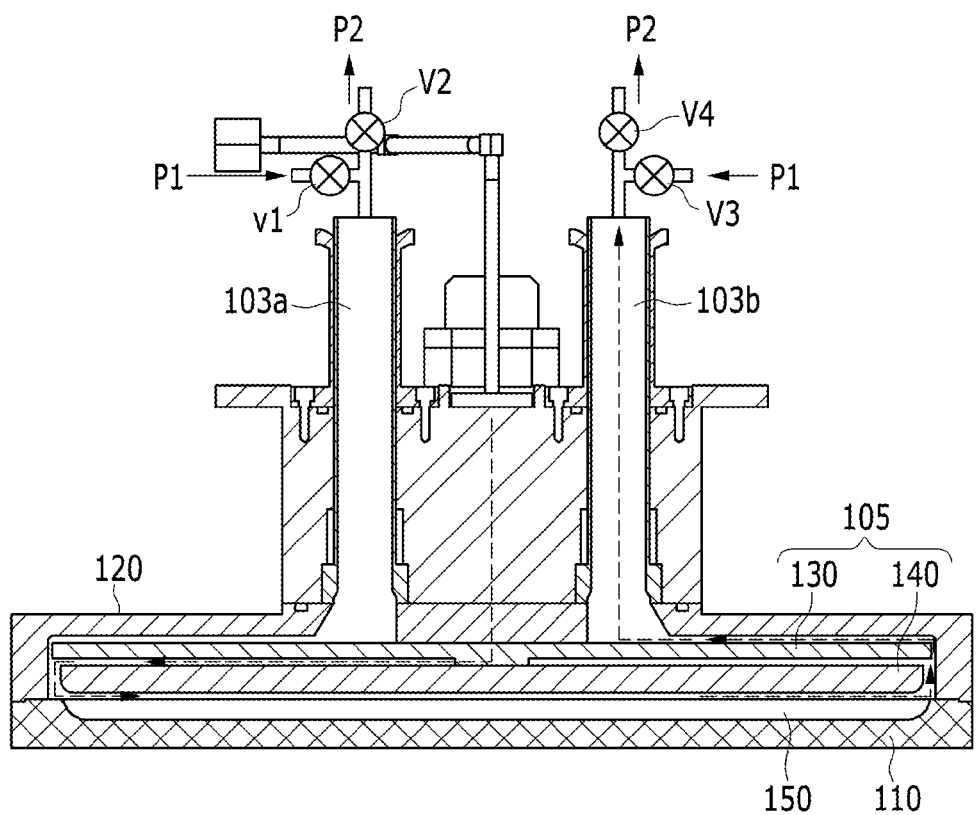
FIG. 2 is a cross-sectional view illustrating a lateral flow ALD apparatus according to an exemplary embodiment.

Hereinafter, a lateral flow ALD apparatus according to an exemplary embodiment will be described with reference to FIGS. 1 and 2. FIGS. 1 and 2 are cross-sectional views illustrating a lateral flow ALD apparatus according to an exemplary embodiment. FIG. 1 is a cross-sectional view of a lateral flow ALD apparatus when a gas inflow channel is viewed from the front, and FIG. 2 is a cross-sectional view of a lateral flow ALD apparatus when a gas inflow channel is viewed from the side.

Referring to FIGS. 1 and 2, a lateral flow ALD apparatus according to an exemplary embodiment includes a reactor support 110 that mounts a substrate 150 in which a thin film is deposited, a reactor cover 120 that defines a reaction chamber by closely contacting the reactor support 110, and a gas flow control unit 105. The reaction chamber includes a reaction space that processes the substrate, and the reaction space is defined as a space between an upper surface of the reactor support 110 and a lower surface of the gas flow control unit 105.

In an upper part of the reactor cover 120, a first gas inlet 101, a second gas inlet 102, a first gas outlet 103a, and a second gas outlet 103b are provided. A lateral flow ALD apparatus according to an exemplary embodiment includes two gas outlets, but a lateral flow ALD apparatus according to another exemplary embodiment may include three or more gas outlets.

The first gas inlet 101 and the second gas inlet 102 may be symmetrically located at both sides with respect to the center of a reactor, and the first gas outlet 103a and the second gas outlet 103b may also be symmetrically located at both sides with respect to the center of the reactor as the first gas inlet 101 and the second gas inlet 102.

The first and second gas inlet 101 and 102 are connected to a source and a reactant or vice versa (not shown). The first and second gas inlet 101 and 102 supply a first reactant and a second reactant, respectively, and preferably reactants are injected in a gas phase through the gas inlet 101 and 102.

A first valve V1 and a second valve V2 are connected to the first gas outlet 103a, and a third valve V3 and a fourth valve V4 are connected to the second gas outlet 103b. An inert gas supply unit P1 is connected to the first valve V1 and the third valve V3, and the second valve V2 and the fourth valve V4 are connected to an exhaust pump P2.

Therefore, when a gas is exhausted, the valves V2 and V4 are opened, and the valves V1 and V3 are closed, and when an inert gas is supplied, the valves V1 and V3 are opened, and the valves V2 and V4 are closed. An inert gas provided from the inert gas supply unit P1 acts to prevent a process gas that is supplied through the first and second gas inlet 101 and 102 from being injected into the first gas outlet 103a and the second gas outlet 103b, respectively.

Further, although not shown in the drawings, a lateral flow ALD apparatus according to an exemplary embodiment may include a switching mechanism for controlling a valve. For example, a programmed computer may be used for a switching mechanism and for sequentially supplying reactants and an inert gas for purge according to a gas supply cycle of an ALD method.

Further, the lateral flow ALD apparatus according to an exemplary embodiment may include a heating device (not shown) that is mounted in a surface of the reactor cover 120. The heating device heats the reactor cover 120 to a constant temperature, thereby preventing the reactant from being condensed (coagulated) at an inside surface of the reactor cover 120.

The reactor support 110 may include a substrate heating unit (not shown). The substrate heating unit is mounted in a lower part of the reactor support 110, and heats and maintains a temperature of the substrate to a desired temperature, i.e., a temperature that is lower than a decomposition temperature of reaction gases and a temperature that is higher than a condensation (coagulation) temperature of reactants, necessary for a process during an atomic layer deposition process.

A substrate support (not shown) that supports the substrate may be made of a metal, and preferably, is electrically grounded. Alternatively, a substrate support (not shown) may be made of a non-metal material such as ceramic. The form and material of such a reactor may be changed according to a design of the reactor.

The gas flow control unit 105 includes a first gas flow control plate 130 and a second gas flow control plate 140. In FIGS. 1 and 2, an arrow indicates a gas flow path of a gas. After a process gas that is supplied through the first gas inlet 101 flows on the substrate via the first gas flow control plate 130 and the second gas flow control plate 140 of the gas flow control unit 105, the process gas is discharged to the second gas outlet 103b, and after the process gas that is supplied through the second gas inlet 102 flows on the substrate via the first gas flow control plate 130 and the second gas flow control plate 140 of the gas flow control unit 105, the process gas is discharged to the first gas outlet 103a.

The first gas flow control plate 130 is stacked on the second gas flow control plate 140, and a central portion of the first gas flow control plate 130 is attached to a bottom surface of the inside of the reactor cover 120. The first gas flow control plate 130 and the second gas flow control plate 140 may be mounted in the reactor cover 120 or may be separated from the reactor cover 120. Maintenance or washing of the first gas flow control plate 130 and the second gas flow control plate 140 can be easily performed by having the above described structure. However, the first gas flow control plate 130 and the second gas flow control plate 140 may form one body as a constituent element of the reactor cover 120. The gas flow control plates 130 and 140 define a gas flow path of each gas, and thus, each gas is injected into the reaction space.

The gas flow control plates 130 and 140 further include a plasma generation electrode and may generate plasma in the reaction space during a deposition process, and some of a plasma generation electrode may be located at a lower surface of the second gas flow control plate 140, and in this case, a plasma generation electrode defines an upper portion of the reaction space.

Figure 3:
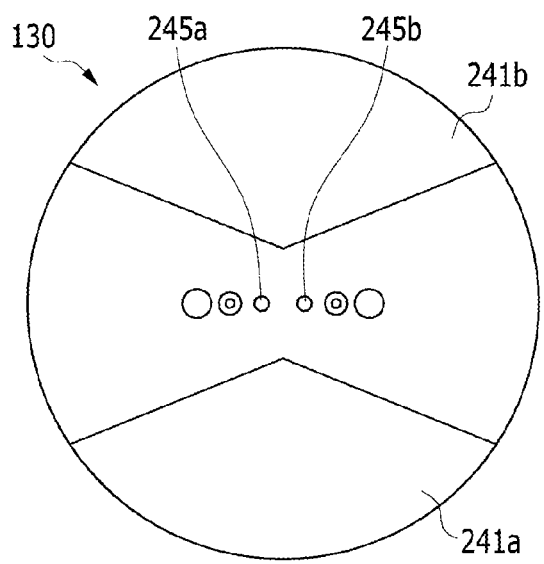
FIG. 3 is a view illustrating an upper portion of a first gas flow control plate of a lateral flow ALD apparatus according to an exemplary embodiment.
Figure 3:
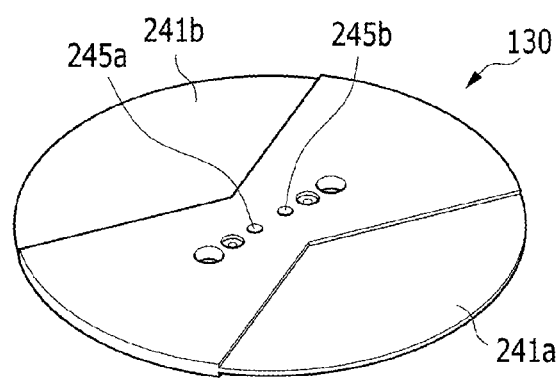

Hereinafter, a gas flow control unit of a lateral flow ALD apparatus according to an exemplary embodiment will be described with reference to FIGS. 3, 5, and 5. FIG. 3 is a view illustrating an upper portion of the first gas flow control plate of a lateral flow ALD apparatus according to an exemplary embodiment, FIG. 4 is a view illustrating a lower portion of the first gas flow control plate of a lateral flow ALD apparatus according to an exemplary embodiment, and FIG. 5 is a side view illustrating a lower part of the second gas flow control plate of a lateral flow ALD apparatus according to an exemplary embodiment.

Figure 4:
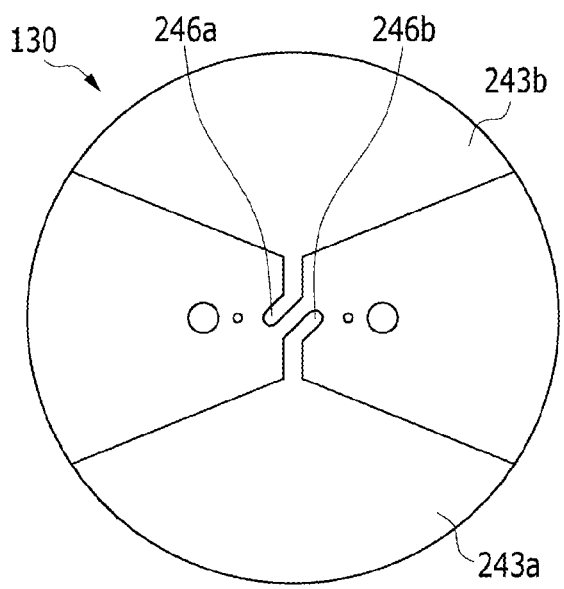
FIG. 4 is a view illustrating a lower portion of a first gas flow control plate of a lateral flow ALD apparatus according to an exemplary embodiment.
Figure 4:
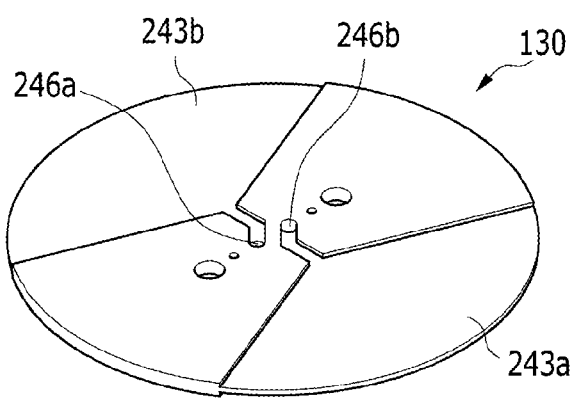
Figure 5:
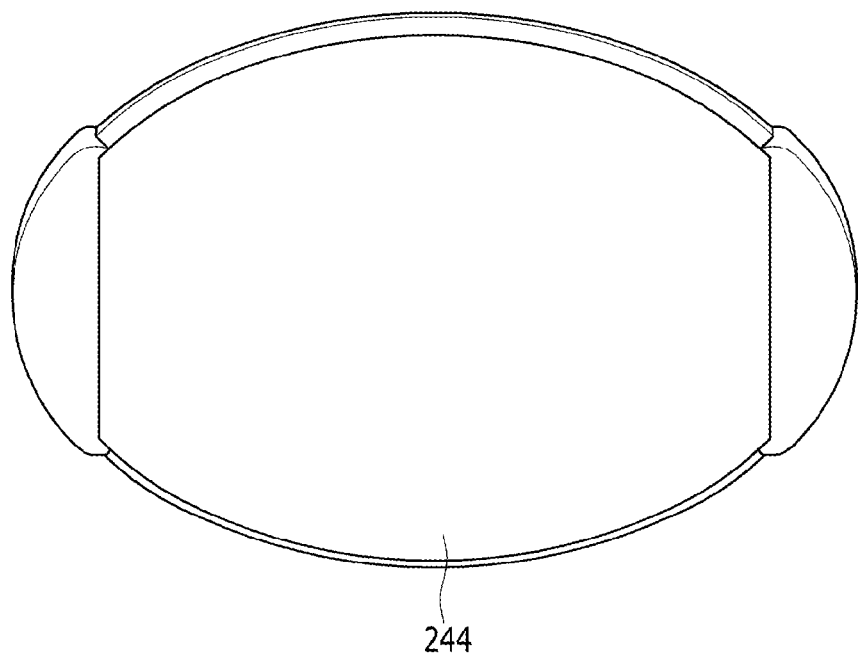
FIG. 5 is a side view illustrating a second lower gas flow control adjusting plate of a lateral flow ALD apparatus according to an exemplary embodiment of the present invention.

Referring to FIGS. 3 and 4, an upper surface of the first gas flow control plate 130 has first and second outflow grooves 241a and 241b that are tapered to a central portion. That is, the first and second outflow grooves 241a and 241b have a fan-shaped form that is widened as advancing from a central portion of the first gas flow control plate 130 toward the edge portion of the first gas flow control plate 130. The first outflow groove 241a defines an outflow passage of a reaction gas and reaction by-products that are remained after a thin film is deposited on a substrate at the reaction space with a portion of a lower surface of the inside of the reactor cover 120. The first outflow groove 241a is connected to the first gas outlet 103a to provide a passage for discharging a gas to the first gas outlet 103a.

Similarly, the second outflow groove 241b defines an outflow passage of a reaction gas and reaction by-products that are remained after a thin film is deposited on a substrate at the reaction space with a portion of a lower surface of the inside of the reactor cover 120, and the second outflow groove 241b is connected to the second gas outlet 103b to provide a passage for discharging a gas to the second gas outlet 103b.

Referring to FIGS. 2 and 3, in an upper part of the first gas flow control plate 130, a first gas outlet 103a and a second gas outlet 103b are disposed. As the second valve V2 of the first gas outlet 103a is opened, when a gas is discharged, the first outflow groove 241a of the upper gas flow control plate 130 defines a gas outflow passage to the first gas outlet 103a together with a lower surface of the inside of the reactor cover 120, and as the fourth valve V4 of the second gas outlet 103b is opened, when a gas is discharged, the second outflow groove 241b of the upper gas flow control plate 130 defines a gas outflow passage to the second gas outlet 103b together with a lower surface of the inside of the reactor cover 120.

Accordingly, a gas inflow direction of a supplied source gas and reaction gas can be controlled. This feature will be described in detail with reference to FIGS. 3 and 4.

The first gas flow control plate 130 has through-holes 245a and 245b that vertically penetrate the first gas flow control plate 130 to the lower holes 246a and 246b of the first gas flow control plate 130, as shown in FIG. 4. The lower holes 246a and 246b of the first gas flow control plate 130 are connected to a fan-shaped gas supply channel through a narrow channel, and thus, guide laminar flow flowing in a constant direction on the substrate together with an upper surface of the second gas flow control plate 140. Specifically, referring to FIG. 4, a lower surface of the first gas flow control plate 130 has first and second inflow grooves 243a and 243b that are tapered to a central portion. That is, the first and second inflow grooves 243a and 243b have a fan-shaped form that is widened as advancing from a central portion of a lower surface of the first gas flow control plate 130 toward the edge portion of the first gas flow control plate 130.

The first inflow groove 243a may be located at a position corresponding to the first outflow groove 241a, and the second inflow groove 243b may be located at a position corresponding to the second outflow groove 241b. The first inflow groove 243a defines a passage of a source gas that is supplied from the first gas inlet 101 together with an upper surface of the second gas flow control plate 140. The second inflow groove 243b defines a passage of a source gas that is supplied from the second gas inlet 102 together with an upper surface of the second gas flow control plate 140.

Referring to FIG. 5, the second gas flow control plate 140 defines an upper portion of the reaction space, and a lower surface of the second gas flow control plate 140 has a recess portion 244 or a depressed portion and is opposite apart by the reaction space from a mounted substrate. The recess portion 244 of the second gas flow control plate 140 is formed parallel to a gas flow direction, and thus, the reaction space may be formed in a tunnel shape having a constant height in a gas flow direction. However, a lower portion of the second gas flow control plate 140 may be a circular flat plate that has a constant thickness and a uniform distance from the substrate.

Figure 6:
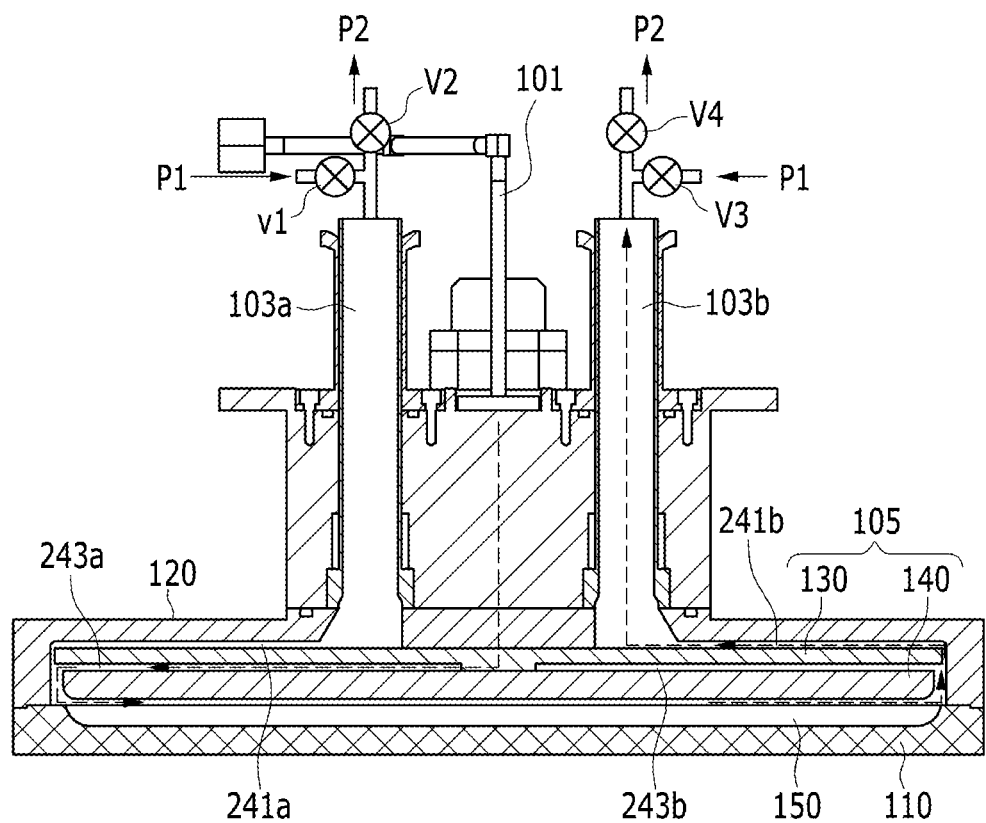
FIGS. 6 and 7 are cross-sectional views illustrating gas inflow and outflow of a lateral flow ALD apparatus according to an exemplary embodiment.
Figure 7:
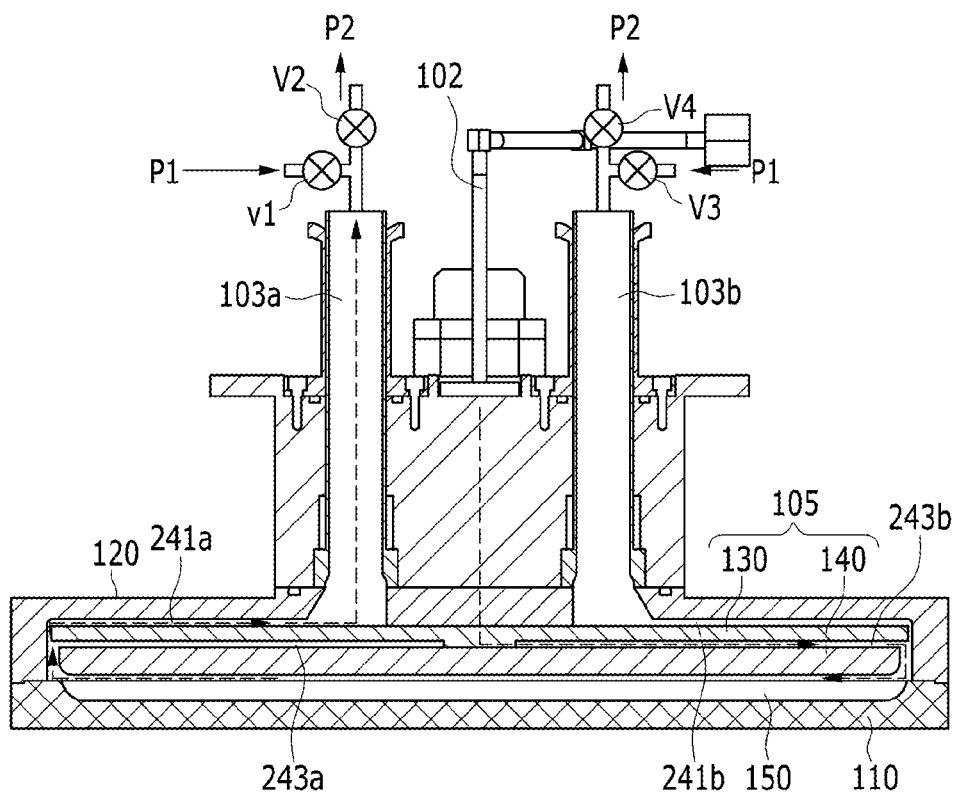

Hereinafter, gas inflow and outflow of a lateral flow ALD apparatus according to an exemplary embodiment will be described with reference to FIGS. 6 and 7. FIGS. 6 and 7 are cross-sectional views illustrating gas inflow and outflow of a lateral flow ALD apparatus to an exemplary embodiment. In FIGS. 6 and 7, an arrow indicates a flow direction of a gas.

Referring to FIG. 6, when a source gas is supplied through the first gas inlet 101, the supplied source gas is flatly spread in a fan shape while flowing through a gas flow passage between the first gas inflow groove 243*a* that is formed in a lower surface of the first gas flow control plate 130 and an upper surface of the second gas flow control plate 140. Thereafter, the source gas flows towards the substrate through a gas moving channel that is defined by a space between a substrate surface and a lower surface of the second gas flow control plate 140. In this case, the source gas flows with a constant laminar flow in a first direction on the substrate. Thereafter, the source gas flowing on the substrate moves through a gas outflow channel between the second outflow groove 241*b* of the first gas flow control plate 130 and a lower surface of the inside of the reactor cover 120 and is exhausted to the outside through the second gas outlet 103*b*. In this case, the third valve V3 that is connected to the second gas outlet 103*b* is closed, and the fourth valve V4 is opened. Further, the second valve V2 that is connected to the first gas outlet 103*a* is closed, and the first valve V1 is opened, and thus, an inert gas such as argon is supplied through the first gas outlet 103*a*. By supplying such a gas, the source gas that is supplied through the first gas inlet 101 is prevented from flowing backward to the first gas outlet 103*a*. Further, as an inert gas, such as argon, is supplied through the second gas inlet 102, the source gas that passes through the reaction space is prevented from flowing backward to the second gas inflow groove 243*b*.

Referring to FIG. 7, when a reactant is supplied through the second gas inlet 102, the supplied reactant is flatly spread in a fan shape while flowing through a gas flow passage between the second gas inflow groove 243*b* that is formed in a lower surface of the first gas flow control plate 130 and an upper surface of the second gas flow control plate 140. Thereafter, the reactant flows towards the substrate through a gas flow channel that is defined by a space between the substrate surface and a lower surface of the second gas flow control plate 140. In this case, the reactant flowing on the substrate flows with a constant laminar flow in a second direction, which is a direction opposite to the first direction. Thereafter, the reactant flowing on the substrate moves through a gas outflow channel between the first outflow groove 241*a* of the first gas flow control plate 130 and a lower surface of the inside of the reactor cover 120 and is thus, exhausted to the outside through the first gas outlet 103*a*. In this case, the first valve V1 that is connected to the first gas outlet 103*a* is closed, and the second valve V2 is opened.

Further, the fourth valve V4 that is connected to the second gas outlet 103*b* is closed, and the third valve V3 is opened, and thus, an inert gas, such as argon, is supplied through the second gas outlet 103*b*. By supplying such a gas, the reactant that is supplied through the second gas inlet 102 is prevented from flowing backward to the second gas outlet 103*b*. Further, as an inert gas, such as argon, is supplied through the first gas inlet 101, the reactant that passes through the reaction space is prevented from flowing backward to the first gas inflow groove 243*a*.

By repeating the step of supplying a source gas as shown in FIG. 6 and the step of supplying a reactant as shown in FIG. 7, a gas flow direction on the substrate can be easily changed and uniformity of a thin film that is formed on the substrate can be improved. A gas that is supplied to the first gas inlet 101 and the second gas inlet 102 may flow in a direction opposite to that of an example that is described with reference to FIGS. 6 and 7.

Referring to FIGS. 6 and 7, an atomic layer deposition method according to an embodiment is described. The atomic layer deposition method according to an embodiment comprises a first gas supply cycle and a second gas supply cycle.

In the first gas supply cycle, the source gas is supplied to a surface of a substrate in a first direction that is substantially parallel to the surface of the substrate through the first gas inlet 101 and the reactant is supplied to the surface of the substrate in a second direction that is substantially parallel to the surface of the substrate and different from the first direction through the second gas inlet 102.

In the second gas supply cycle, the source gas is supplied to the surface of the substrate in the second direction through the second gas inlet 102 and the reactant gas on the surface of the substrate in the first direction through the first gas inlet 101.

During the first gas supply cycle, the first source gas supply step and the first reactant supply step are repeated and during the second gas supply cycle, the second source gas supply step and the second reactant supply step are repeated.

During the first gas supply cycle, the first source gas supply step and the first reactant supply step are alternately repeated and during the second gas supply cycle, the second source gas supply step and the second reactant supply step are alternately repeated.

The first gas supply cycle and the second gas supply cycle are repeated. The first gas supply cycle and the second gas supply cycle are alternately repeated. The second direction may be opposite to the first direction.

By providing a plurality of gas inflow channels and gas outflow channels to the lateral flow ALD reactor, the gas flow direction on the substrate can be changed easily in various directions to improve film uniformity. Further, the lateral flow ALD apparatus may have two or more gas outlets.

In this way, the lateral flow ALD apparatus according to an exemplary embodiment has two gas inflow channels and two gas outflow channels that are symmetrically formed based on a substrate in which a thin film is deposited, thereby differently guiding a flow direction of a gas flowing on the substrate. Therefore, uniformity of a deposited film is improved, compared to the conventional lateral flow ALD apparatus in which the supplied source gas and reactant flow only in a constant direction on the substrate.

Further, the ALD apparatus according to an exemplary embodiment has two gas inflow grooves and two gas outflow grooves that are formed symmetrically to a first gas flow control plate and guides the gas flow in two different directions without requiring an additional gas flow control plate or without a need for rotating a substrate during the process, and thus, the structure of the deposition apparatus may be simplified, and production and maintenance costs can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A lateral flow atomic layer deposition (ALD) apparatus in which a process gas flows between a surface in which a substrate is placed and a surface opposite thereto in a direction that is parallel to the substrate, the lateral flow ALD apparatus comprising:
 a substrate support supporting the substrate;
 a reactor cover contacting the substrate support to define a reaction chamber;

a first gas flow control plate located between the reactor cover and the substrate support;

a second gas flow control plate located between the reactor cover and the substrate support, and below the first gas flow control plate;

a first gas inlet connected to a first gas inflow passage and a second gas inlet connected to a second gas inflow passage; and a first gas outlet connected to a first gas outflow passage and a second gas outlet connected to a second gas outflow passage, wherein the first gas outflow passage and the second gas outflow passage are disposed between an upper surface of the first gas flow control plate and a lower surface of an inside of the reactor cover, wherein the first gas inflow passage and the second gas inflow passage are disposed between the first gas flow control plate and the second gas flow control plate.

2. The lateral flow ALD apparatus of claim 1, wherein the first gas outlet and the second gas outlet are located at an opposite side based on an upper surface of the substrate.

3. The lateral flow ALD apparatus of claim 1, wherein the first gas inflow passage and the second gas inflow passage are located at an opposite side with respect to an upper surface of the substrate.

4. The lateral flow ALD apparatus of claim 2, wherein the first gas outflow passage and the second gas outflow passage are defined by a first outflow groove and a second outflow groove that are formed at the upper surface of the first gas flow control plate and the lower surface of an inside of the reactor cover.

5. The lateral flow ALD apparatus of claim 3, wherein the first gas inflow passage and the second gas inflow passage are defined by a first inflow groove and a second inflow groove that are formed at a lower surface of the first gas flow control plate and an upper surface of the second gas flow control plate.

6. The lateral flow ALD apparatus of claim 5, wherein a process gas supplied through the first gas inlet flows as laminar flow in a first direction on the substrate via the first gas inflow passage.

7. The lateral flow ALD apparatus of claim 6, wherein a process gas flowing in the first direction on the substrate is exhausted to the outside of the reactor through the second gas outflow passage.

8. The lateral flow ALD apparatus of claim 6, wherein a process gas supplied through the second gas inlet flows as laminar flow in a second direction on the substrate via the second gas inflow passage.

9. The lateral flow ALD apparatus of claim 8, wherein a process gas flowing in the second direction on the substrate is exhausted to the outside of the reactor through the first gas outflow passage.

10. The lateral flow ALD apparatus of claim 8, wherein the second direction is opposite to the first direction.

11. The lateral flow ALD apparatus of claim 2, wherein the first gas outlet comprises a first valve connected to an exhaust pump and a second valve connected to an inert gas supply line and the second gas outlet comprises a third valve connected to the exhaust pump and a fourth valve connected to the inert gas supply line.

12. The lateral flow ALD apparatus of claim 11, wherein the third valve is closed and the fourth valve is opened, thereby the inert gas being supplied through the second gas outlet, when a process gas is exhausted through the first gas outlet.

13. The lateral flow ALD apparatus of claim 12, wherein an inert gas is supplied to the first gas inflow passage through the first gas inlet, when a process gas is exhausted through the first gas outlet.

14. The lateral flow ALD apparatus of claim 11, wherein the first valve is closed and the second valve is opened, thereby the inert gas being supplied through the first gas outlet, when a process gas is exhausted through the second gas outlet.

15. The lateral flow ALD apparatus of claim 14, wherein the inert gas is supplied to the second gas inflow passage through the second gas inlet, when a process gas is exhausted through the second gas outlet.

* * * * *